United States Patent [19]

Bathaee et al.

[11] Patent Number: 5,117,314

[45] Date of Patent: May 26, 1992

[54] DISK DRIVE PULSE DETECTION METHOD AND CIRCUIT

[75] Inventors: Mehdi Bathaee, Riverside; Takashi Asami, Huntington Beach, both of Calif.

[73] Assignee: Western Digital Corporation, Irvine, Calif.

[21] Appl. No.: 372,274

[22] Filed: Jun. 27, 1989

[51] Int. Cl.$^5$ .............................................. G11B 5/09
[52] U.S. Cl. .................................. 360/51; 360/73.03
[58] Field of Search ................... 360/51, 46, 73.03; 375/108, 111; 369/59, 60; 307/234, 510, 517, 518

[56] References Cited

U.S. PATENT DOCUMENTS

| | | | |
|---|---|---|---|
| 4,641,044 | 2/1987 | Shiraishi | 307/269 |
| 4,682,048 | 7/1987 | Ishimoto | 307/269 |
| 4,688,947 | 8/1987 | Blaes et al. | 368/120 |
| 4,700,084 | 10/1987 | Homaker, Jr. | 307/518 |
| 4,797,574 | 1/1989 | Okubo et al. | 307/269 |
| 4,938,290 | 5/1990 | Vo | 341/61 |

*Primary Examiner*—Aristotelis Psitos
*Assistant Examiner*—Darsha V. Sheladia
*Attorney, Agent, or Firm*—Christie, Parker & Hale

[57] ABSTRACT

The combination of a rotating data storage disk and a pulse detector for generating an output pulse synchronized with clock pulses. The detector has a beginning of input pulse sensor for pulses derived from the disk, a timing circuit responsive to the sensing of the beginning of one of the input pulses for generating an output pulse of substantially constant pulse width and synchronized with clock pulses. A pulse presence sensor inhibits the timing circuit from generating another output pulse for any such detected input pulse, until after the sensed input pulse terminates.

26 Claims, 5 Drawing Sheets

NARROW PULSE CASE

WIDE PULSE CASE (A TYPICAL DFF DESIGN)

DISK DRIVE PULSE DETECTION METHOD AND CIRCUIT

FIELD OF THE INVENTION

This invention relates to improved disk drive transition pulse detectors and more specifically to pulse detectors that accept asynchronous input pulses having variable pulse width from rotating data storage disks, and provide constant width synchronized output pulses.

BACKGROUND OF THE INVENTION

Data processing systems employing a rotating magnetic storage disk in disk drive and a host computer in which data is recorded on and read back from the disk drive are well known in the art. One common type of disk drive used in such a system is a disk drive utilizing a rotating hard disk with a magnetic recording surface. A radially movable read/write head is positioned with respect to any of a number of tracks on the disk using, for example, a voice coil driven servo tracking system.

The signals read by the head from the disk are passed through a read channel amplifier, which amplifies and massages the signals to a pulse form in which each pulse represents a binary bit of information. However, the signals from the read channel amplifier are of variable width, of variable spacing, and unsynchronized. Accordingly, pulse detector circuits are provided for converting the variable width, variable spaced and unsynchronized signals to signals synchronized with clock pulses. For each unsynchronous pulse input, a synchronized pulse is provided by the pulse detector. The synchronized pulses are then provided to a servo signal processor and back to the disk controller. The servo signal processor, under control of a disk controller, then applies signals back to a head positioning controller, preferably in the form of a voice coil driven servo tracking system to properly position the head with respect to a track on the disk for reading or writing in the track.

Typically, each pulse derived from the disk drive represents a binary coded bit of information. As the density of recorded pulses or bits of information increase the rate at which the pulses are transferred to and from the disk drive also increases. With increases in pulse transfer rate and recording density, there are increases in pulse jitter, in variations of intervals between pulses and in variations in pulse width. The widths of the pulses derived from the disk drive are typically controlled by a circuit, which employs an RC time constant, that varies from unit to unit and, even in the same unit, varies with external environment, such as temperature and power supply.

Pulse detectors are commonly employed for detecting the pulses derived from disk drives and for converting these pulses into synchronized pulses of constant width and constant spacing for the host computer.

Pulse detectors are known which receive a train of asynchronous and variable width pulses derived from disk drives and translates them into a train of synchronous constant width pulses. Prior pulse detectors are typically imbedded deeply in the controller or another part of the disk drive system or, for example, a host computer with which it is to operate and cannot be readily isolated from other portions of the system. However, the designs used in prior pulse detectors can generally be divided into two general strategies. One strategy is the generation of a data rate clock to latch or sample incoming pulses. The second strategy is to capture the incoming pulse and digitize it to the closest clock edge.

The first strategy typically involves the use of a phase lock-loop circuit, such as that depicted in FIG. 6. Unsynchronized variable width pulses RDD, derived from a disk drive, are provided to an analog phase lock-loop. A comparator compares the frequency of the RDD pulses with that of the pulses from a voltage control oscillator (VCO). The frequency of the pulses from the VCO are adjusted s that they are synchronized with the RDD input pulses. The clock pulses are then used to transfer the input pulses RDD into flip flops, the outputs of which are decoded and transferred to other storage elements in the system. Once the phase lock is achieved, it is a highly reliable arrangement and is not subject to limitations of pulse detectors using the second strategy (to be discussed). However, the phase lock-loop is subject to the following disadvantages. First, the cost of a reliable phase lock-loop (PLL) is much higher than that of a pulse detector employing the second strategy. Second, if the PLL implementation is of the analog type, it is likely to be effected by environmental conditions, such as temperature. Third, digital type PLLs require significantly higher clock frequency than the incoming pulse rate, making it impractical above certain pulse rates. Fourth, in order to achieve a lock, it requires a precursor of pulses before the phase lock-loop will properly function. However, this approach is still often used, because of its long term reliability, but it is an overdesign for many applications and the high cost is not acceptable. In some cases, a pulse detector utilizing the second strategy is used as a building block for a phase lock loop.

The second strategy is, in general, lower in cost than the first one and is preferred. However, the performance range has typically been limited. Under the second strategy, two different types of implementation techniques have been employed. One being pulse level sensing and the other being pulse edge trigger sensing.

FIG. 7 depicts a prior art level sensing type of pulse detector. In this arrangement a transfer gate is employed, connected between a clock (CLK) and an inverted clock (CLK') with the control gate thereof, connected to the RDD source of unsynchronized variable width pulses derived from a disk drive. The output of the transfer gate is connected to the input of a first inverter. A second inverter is connected from the output back to its input of the first inverter, so as to form a latch. Three or more essentially similar stages, each connected to the output of an inverter of the prior stage, are used to form synchronized signals (TXD), which may be passed to a host computer. This approach checks for the polarity of the incoming signal during one phase of the clock and outputs the result of the sampling in another phase of the clock. Although the circuit has some advantages, such as smaller implementation than edge detectors, a higher tolerance to random noise input than some pulse detectors and the same circuit can be applied to both high pulse rates and low pulse rates, there are significant disadvantages. One disadvantage of the level sensing type pulse detector is its intolerance to input pulse widths which are equal to or narrower than one sampling clock cycle that repeats as fast as or faster than two sampling clock cycles (the Nyquist rate) which is a typical condition in disk drives. Another disadvantage is that the output pulse widths vary with the width of the input pulse.

Edge trigger type pulse detectors, such as that depicted in FIG. 8, detects the rising, or falling, edge of an input pulse and sets a latch. The output of the latch is synchronized by a subsequent circuit with clock pulses, such as CLK. The output of the subsequent circuit is then fed back to the latch to clear it after the signals stored in the subsequent circuit can be reliably read. By way of example, the circuit of FIG. 7 includes D-type flip flops (DFF), a first one of which is triggered by the rising or falling edge of a pulse RDD derived from a disk drive, a second of which is set in response to a signal from the first DFF (caused by the sensing of the edge of the RDD pulse) and a clock pulse CLK and a third, of which is set by the output of the second DFF and a subsequent CLK pulse. The output of the third DFF provides the synchronized constant width pulse TXD used by the rest of the system. FIG. 9 is a schematic representation of the details of a typical DFF design. Although the edge trigger type pulse detector has certain advantages, such as tolerance to narrow input pulse widths and constant output pulse widths, it has significant disadvantages. One disadvantage is that edge triggered flip flops are required which, in turn, require more circuitry than level sensing type circuits. A further disadvantage is that the circuit is intolerant to input pulses which are wider than the output pulse from the edge triggered circuit. More specifically, if the input pulse is wider than the output pulse from the edge triggered pulse detector, more than one synchronized output pulse may result.

In summary, both the level and edge trigger type pulse detectors have drawbacks that limit their operational ranges in terms of input pulse width and output pulse width.

Synchronization concepts are discussed at pages 218-262 of the book *Introduction to VLSI Systems*, published 1980 by Addison-Wesley Publishing Company, Inc., and the paper entitled "The Behavior of Flip Flops Used as Synchronizers and Prediction of Their Failure Rate," IEEE Journal of Solid State Circuits, Vol. SC-15, No. 2, April 1980.

SUMMARY OF THE INVENTION

An embodiment of the present invention overcomes the above disadvantages. Included are a rotating data storage disk and a pulse detector. The pulse detector generates an output pulse synchronized with clock pulses. The pulse detector has a beginning of input pulse sensor for pulses derived from the disk, a timing circuit responsive to the sensing of the beginning of one of the input pulses for generating an output pulse of substantially constant pulse width and synchronized with clock pulses. A pulse presence sensor inhibits the timing circuit from generating another output pulse for any such detected input pulse, until after the sensed input pulse terminates. With this arrangement, the pulse detector will reliably sense either narrow or wide asynchronous pulses from the disk and will reliably provide a single constant width synchronized output pulse for each such input pulse.

Preferably, the timing circuit comprises a feedback circuit responsive to the presence of the output pulse for enabling the time delay circuit to terminate the output pulse after a predetermined delay equal to the constant pulse width.

The beginning of pulse detector, preferably, initiates the propagation of a signal through the time delay circuit.

Preferably, the beginning of pulse detector initiates the propagation of a signal through the timing circuit to start the output pulse and the feedback circuit, upon formation of the output pulse, initiates the propagation of a signal through the timing circuit to terminate the output pulse, after a predetermined time delay.

Preferably, the beginning of input pulse detector and the input pulse presence sensor are each Muller-C type elements, which are characterized for changing their output state between two output states, if, and only if, the state of both of two inputs thereof change to an opposite one of two states from an immediately prior output state of the element.

The pulse detector, preferably, is formed on a common CMOS chip.

One embodiment is the subcombination of the pulse detector and another is a method. Advantages that may be achieved with an embodiment of the present invention include:

1. A wide range of input pulse widths are accepted, from a few nanoseconds (implementation dependent) to several clock cycles;
2. For an input of a pulse, a pulse is output, exactly one clock cycle wide, regardless of the input pulse width;
3. The CMOS integrated circuit implementation is not much larger than level sensing type circuit, and much smaller than edge triggered type;
4. The synchronizer part of the circuit can be optimized (in terms of number of synchronizing stages) to each application, independent of the pulse detect function; and
5. Most parts of the circuit may be clocked, making its operation largely immune from the semiconductor process variations and environmental variations (temperature, power supply voltage, etc.).

BRIEF DESCRIPTION OF THE DRAWINGS

FIG. 2 is a circuit diagram of a preferred embodiment of a pulse detector circuit according to the present invention;

FIG. 3 is a circuit diagram of the Muller-C elements used in the circuit of FIG. 1;

DETAILED DESCRIPTION OF THE INVENTION

Figure 1:
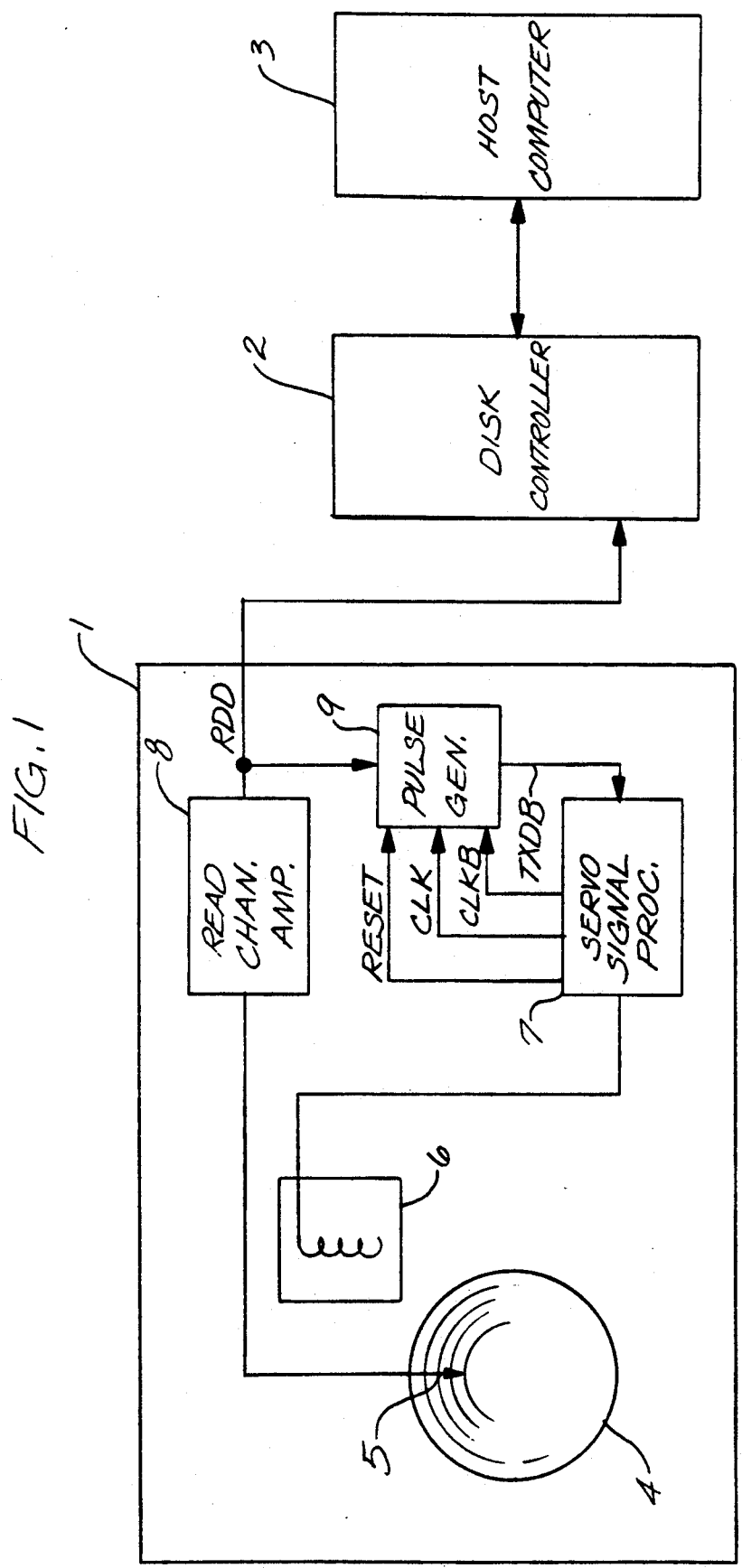
FIG. 1 is a block diagram of a disk drive, a disk controller and a host computer in which a pulse detector is employed for converting the variable width, variably spaced and asynchronous pulse derived from the disk drive to constant width synchronized pulse.

Consider now the data processing system, including the disk drive subsystem of FIG. 1. The disk drive subsystem includes a disk drive 1, a disk controller 2 and a host computer 3. The host computer 3 is a conventional personal computer or similar type of microcomputer, for processing digital data in the form of synchronized pulses. The disk drive 1 includes one or more conventional rotating data storage disks, only one of such disks 4 is being shown by way of example. Each disk has a concentric circular tracks on a magnetic recording surface from which signals are read and written by a radially movable head 5.

A conventional voice coil head positioner 6 positions the head at the correct radial position with respect to the desired track under control of the disk controller 2 and a servo tracking system, including servo amplifier 7, a read channel amplifier 8 and a pulse detector 9. Signals from the read/write head 5 are passed through the read channel amplifier 8 which amplifies and massages the data into an acceptable form as pulses RDD for input to the pulse detector 9.

The signals RDD from read channel amplifier 8 and derived from the disk are in the form of asynchronous, variable width and variable spaced pulses. The pulse detector 9 senses and converts each RDD input pulse into a synchronized constant width pulse in output signal TXDB, which is applied as input to the servo signal processor 7. The signals read from each track on the disk 4 include both head positioning data and information data. Servo signal processor 7 discriminates between the two types of data, using the head positioning data to cause head positioner 6 to position the head 5 at the optimum position with respect to the desired track. To be discussed in more detail, the pulse detector 9 receives reset control signals, clock CLK and inverted clock CLKB signals from the servo signal processor 7, which are used by the pulse detector for generating the synchronized constant width pulses in signal TXDB.

The disk controller 2 processes the data read from the tracks on the disk and provides synchronized pulses and transmits them to the host computer 3. In addition, the disk controller provides signals to circuitry (not shown) in the disk drive 1 to select the desired disk surface and track at which signals are to be read or written.

Figures 2, 3:
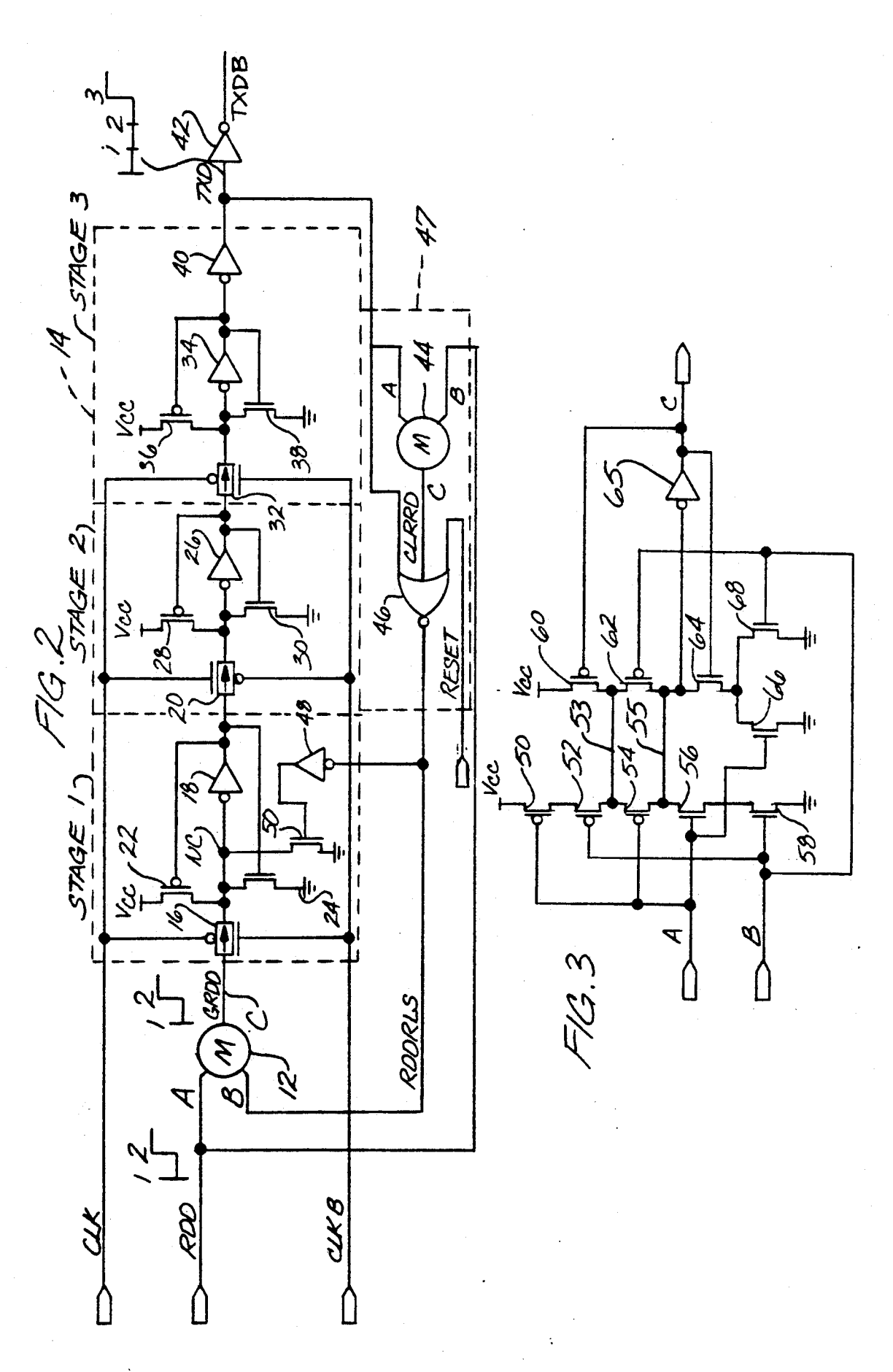
Figure 4:
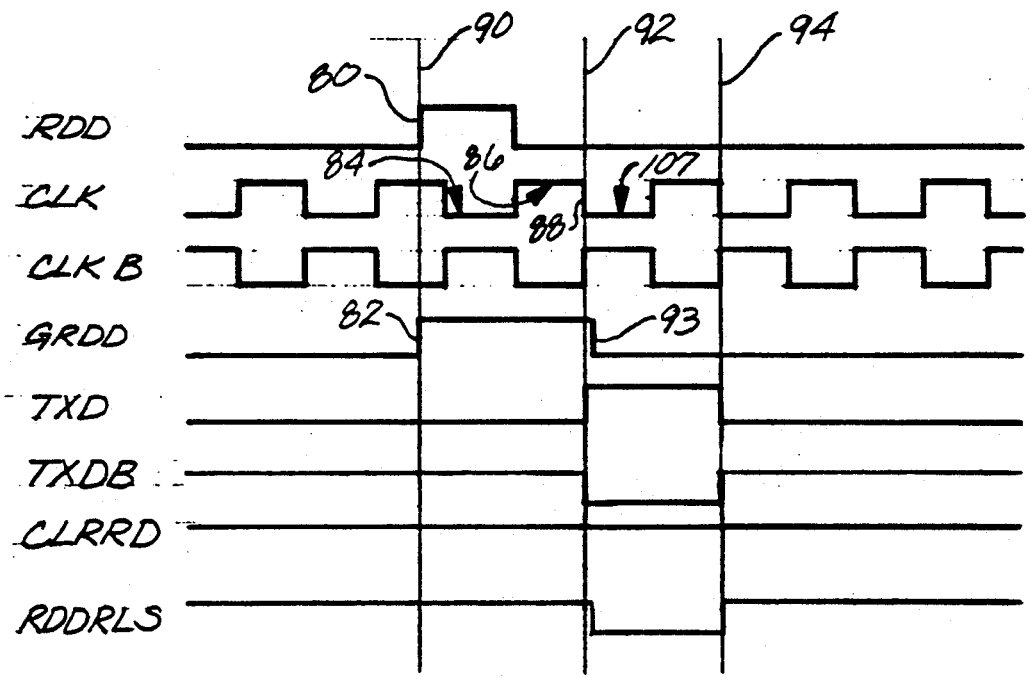
FIG. 4 is a timing diagram showing the status of the circuit of FIG. 1 at various locations in the case of a narrow input pulse.
Figure 5:
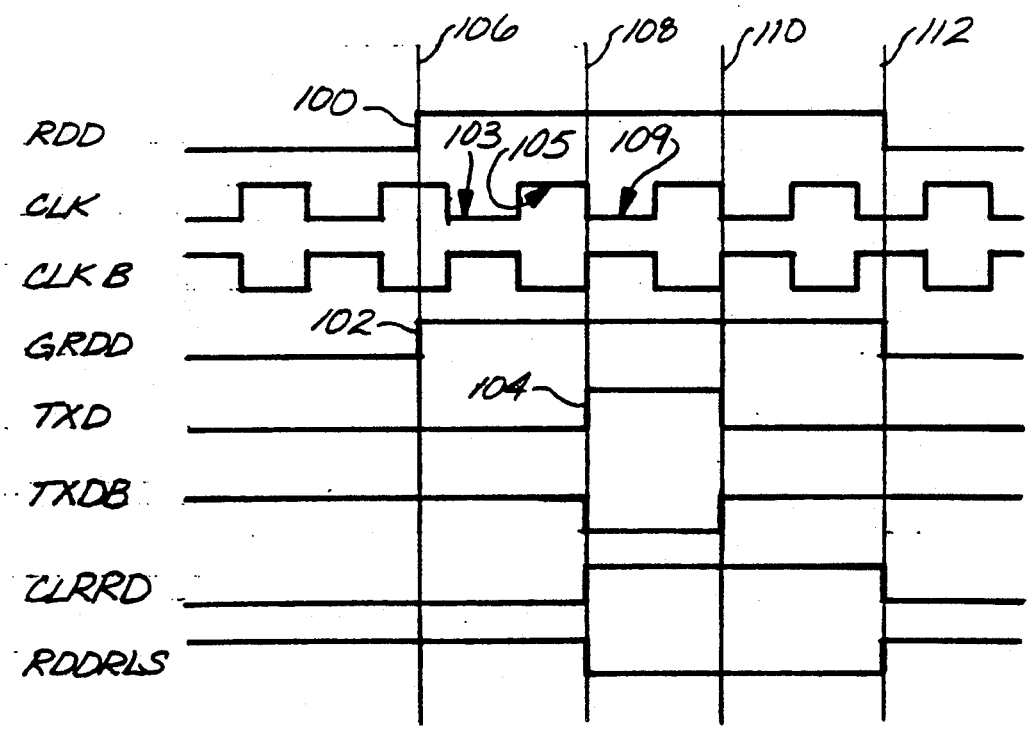
FIG. 5 is a timing diagram similar to that of FIG. 3 for the case of a wide input pulse.
Figure 6:
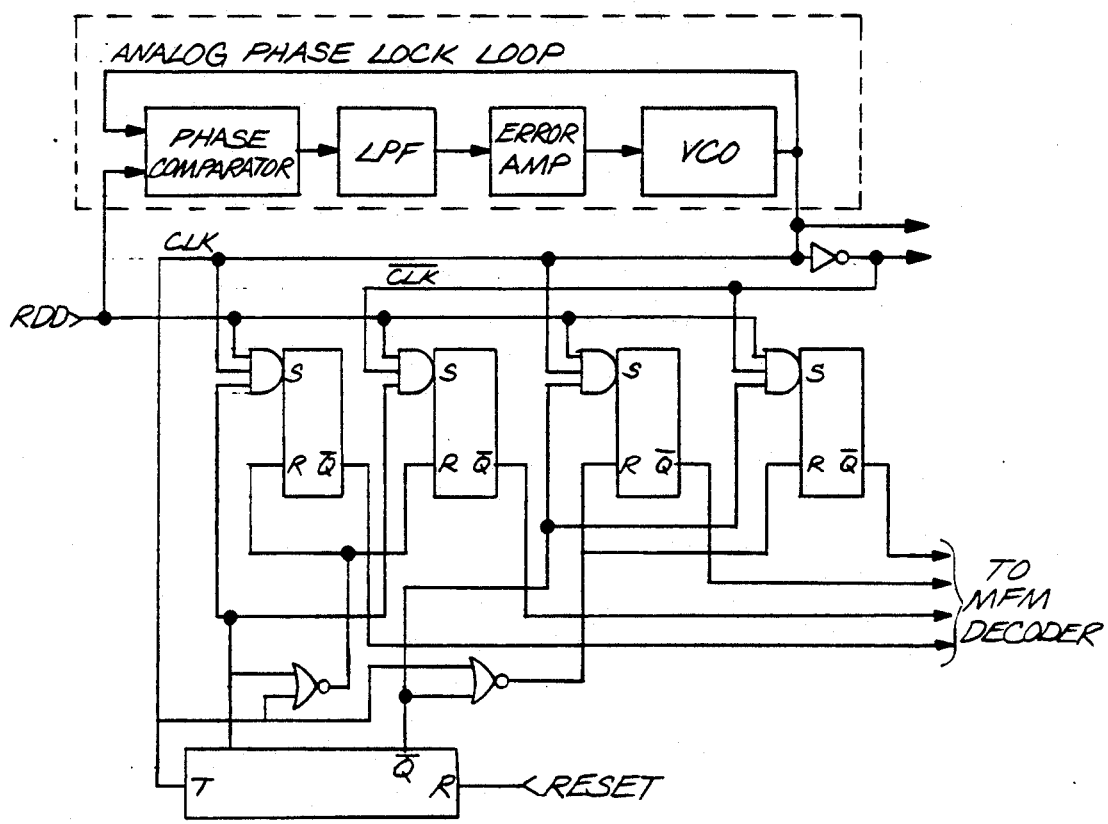
FIG. 6 is a schematic and block diagram of a prior art phase lock-loop circuit.
Figure 7:
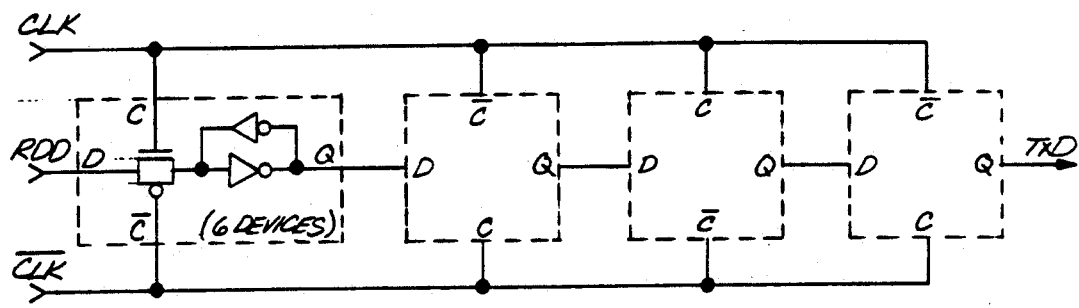
FIG. 7 is, a schematic and block diagram of a prior art level sensing pulse detector.
Figure 8:
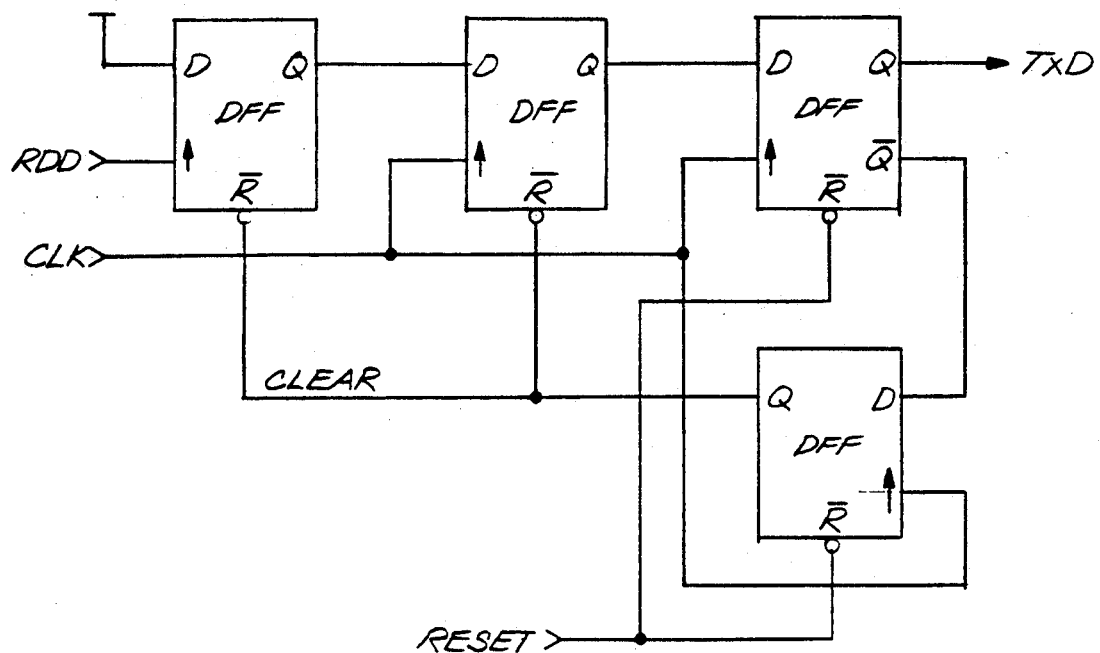
FIG. 8 is a schematic and block diagram of a prior art edge sensing pulse detector.
Figure 9:
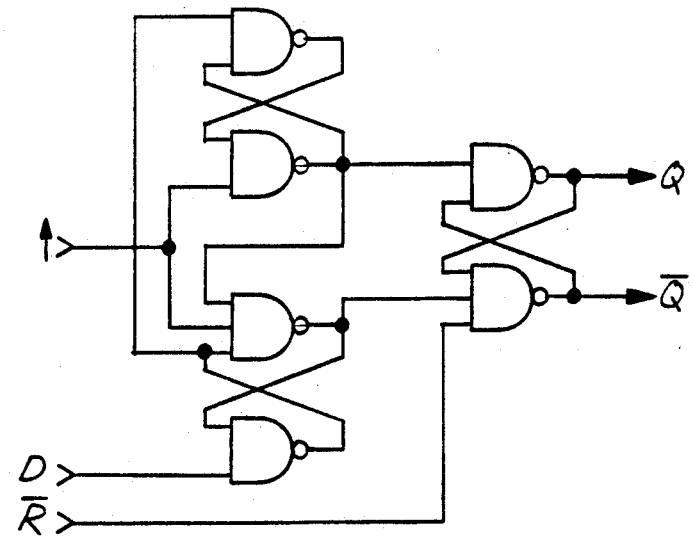
FIG. 9 is a schematic and block diagram of a prior art typical D-flip-flop.

Consider now the embodiment of the pulse detector as shown in FIG. 2 and 3 and the wave form diagrams of FIGS. 4 and 5. Preferably all of the components shown are implemented in a complementary metal oxide semiconductor (CMOS) process on a common substrate. The Read data RDD signal contains asynchronous input pulses of positive polarity, variable spacing and variable width. The output of the circuit of FIG. 2 is a transition data TXD signal and its compliment the transition data bar TXDB signal, each containing one synchronized one clock cycle long pulse for each input pulse in the RDD signal. The circuit is controlled by positive CLK clock and inverted CLKB clock signals, which are 180 degrees out of phase from each other. The system is initialized by a reset input (RESET) signal, a positive true signal, while the RDD pulse signal is low. The RDD signal is applied to a first or A input to CMOS Muller-C element 12 (shown in greater detail in FIG. 2). The element 12 transmits a gated read data (GRDD) signal to stage 1 of synchronizing circuit 14.

The first stage 1 of the synchronizing circuit 14 has a CMOS transistor transfer gate 16. A P channel input of gate 16 receives the CLK signal and an N channel input receives the inverse CLKB signal. Accordingly, the transfer gate 16 is open when the CLK signal is low and the CLKB signal is high and applies the GRDD signal to CMOS inverter 18, the output of which in turn is connected to the input of another CMOS transistor transfer gate 20 in stage 2 of the synchronizing circuit 14.

Transfer gate 20 is inverted from gate 16 so that its N channel input is connected to the CLK signal and its P channel input is connected to the CLKB signal. The output of inverter 18 is connected to the gate of P channel MOS transistor 22. The source of P channel MOS transistor 22 is connected to a reference voltage source VCC and its drain is connected to the output of the first transfer gate 16. The inverter 18 output is also connected to the gate of N channel MOS transistor 24, the source of which is connected to ground and the drain of which is also connected to the output of the first transfer gate 16. The transfer gate 16, inverter 18 and opposing transistors 22, 24 make up stage 1, a synchronizing stage of the synchronizing circuit 14.

Stage 2 of the synchronizing circuit 14 is similar to stage 1, except the inverter 48 and N channel MOS transistor 50. However, CMOS transistor transfer gate 20 is inverted from transfer gate 16 Transfer gate 20 has an input connected to the output of inverter 18 and an output connected to the input of CMOS inverter 26, the output of which is connected to the gate of P channel MOS transistor 28 and to the gate of N channel MOS transistor 30. The source of the P channel transistor 28 is connected to the same reference potential source VCC and its drain is connected to the input of the CMOS inverter 26. The source of the N channel transistor 30 is connected to ground and the drain is connected to the input of the inverter 26. The output of the inverter 26 is connected to the input of a third CMOS transfer gate 32, of stage 3 of the synchronizing circuit 14.

Stage 3 is a synchronizing circuit similar to stage 1. A P channel input of CMOS transistor transfer gate 32 is connected to the CLK signal and the N channel input is connected to the inverse CLK signal. Accordingly, the output of transfer gate 32 is coupled to the input of CMOS inverter 34, the output of which is connected to the gate of P channel MOS transistor 36 and the gate of N channel MOS transistor 38. The source of the P channel transistor 36 is connected to the same reference potential source VCC and its drain is connected to the input of CMOS inverter 34. The source of the N channel transistor 38 is connected to ground and the drain is connected to the input of CMOS inverter 34. The output of the inverter 34 is coupled to a fourth CMOS inverter 40 and the output of the inverter forms the synchronized TXD output pulses or signal of the circuit 14. The output of inverter 40 is connected to the input of another CMOS inverter 42 which generates the synchronized inverse transition data TXDB output pulses or signal and isolates the synchronous circuit 14 from the output load.

The output of inverter 40 is connected to a first or A input of a second CMOS Muller-C element 44 and to one of three inputs to a CMOS NOR gate 46. A second or B input of the Muller-C element 44 is connected to the A input of the first Muller-C element 12 and therefore receives the RDD signal. The output of the Muller-C element 44 forms a clear read data (CLRRD) signal and is connected to a second input to the NOR gate 46. The third input to the NOR gate 46 receives a reset (RESET) signal. The output of the NOR gate 46, forms a read data release (RDDRLS) signal and is connected to the second or B input of the first Muller-C element 12. The output of NOR gate 46 is also connected to the input of a CMOS inverter 48 of stage 1 of circuit 14 whose output is connected to the gate of an N channel CMOS transistor 50 in stage 1. The source of the N channel transistor 50 is coupled to ground and the drain is connected to node NC which is the input of the inverter 18.

A Muller-C element is characterized in that its output becomes 1 (i.e., goes to one state) only after all of its inputs are 1 (i.e., gone to that one state) and its output becomes 0 (i.e., goes to a second 0 state) only after all of its inputs are 0 (i.e., goes to that second state). An example of a Muller-C element and a description of the element is given in the above referenced book by Addison Wesley, pages 254 to 255, the disclosure of which is incorporated herein by reference.

The Muller-C elements 12 and 46 are identical and the preferred circuit is shown in more detail in FIG. 3 Each Muller-C element has a first string of five CMOS transistors. The first P channel transistor 50 has its source connected to the same reference potential source VCC and its drain connected to the source of a second P channel transistor 52. The drain of the second P channel transistor is connected to the source of a third P channel transistor 54. The drain of the third P channel transistor is connected to the drain of an N channel transistor 56. The source of the N channel transistor 56 is connected to the drain of another N channel transistor 58, the source of which is connected to ground. Input A is connected to gates of the first, third and fourth transistors 50, 54, 56. Input B is connected to the second and fifth transistors 52, 58.

Each Muller-C element also has a second string of five MOS transistors. A first P channel transistor 60 has its source connected to the same reference potential source VCC and a drain connected to the source of a second P channel transistor 62. The drain of the second transistor 62 is connected to the drain of an N channel transistor 64. The source of the N channel transistor 64 is connected to the drains of two parallel N channel transistors 66, 68, the sources of which are connected to ground. The gate of transistor 66 is connected to the A input and the gate of N channel transistor 68 is connected to the B input. The gate of the second P channel transistor 62 is also connected to the B input. The first and third transistors in the string 60, 64 are connected to the output C. In addition, the drain of the second transistor 52 in the first string is connected to the drain of the first transistor 60 in the second string. Similarly, the drain of the third transistor 54 in the first string is connected to the drain of the second transistor 62 in the first string. The drains of these transistors are coupled to an inverter 65, the output of which constitutes the output C.

The Muller-C elements are a primary ingredient of the circuit. This logic element changes its output if and only if both inputs turn to a polarity opposite that of the existing output. The Muller-C elements, the circuit is event driven by the raw data read from disk.

Consider now the operation of the Muller-C element of FIG. 3. When the output C is low, transistors 54, 62, 56 and 58 in effect form a 2 input NAND gate to line 55 going to inverter 65. When output C is high, transistors 50, 52, 54, 64, 66, and 68 in effect form a 2 input NOR gate. Inverter 65 and other circuit elements cooperate to form a storage circuit for the state of the Muller-C element.

Assume the output C and the two inputs A and B are low. Transistors 50, 52 and 54 are all on and therefore line 55 is pulled up to the VCC voltage level holding the input to the inverter 65 high and its output low. Since input B and output C are low, transistors 60 and 62 are on and therefore also connect line 55 to VCC.

Assume that input A alone goes high while output C is low, transistors 50 and 54 go off but transistors 60 and 62 stay on, keeping line 55 at VCC and the output C low.

Assume input B alone goes high while output C is low. Transistors 52 and 62 turn off but transistors 60 and 54 stay on and connect line 55 to VCC keeping the output C low.

Assume that both inputs A and B go high while output C is low. Transistors 50, 52, 54 and 62 turn off and transistors 56, 58, 66, 68 turn on. Thus line 55 is disconnected from VCC and is grounded (or low) through transistors 56 and 58 causing inverter 65 to apply a high signal at output C. Transistor 64 is then turned on and the inverter is maintained with a high signal at output C.

Assume that input A alone goes low while output C is high. Transistors 50 and 54 turn on but transistor 52 stays off therefore, line 55 is not connected to VCC. Although transistor 66 goes off, transistor 68 stays on and through transistor 64, keeps line 55 at ground and therefore the output C high.

Assume now that input B alone goes low while output C is high. Transistors 52 and 62 go on but transistors 50, 54 and 60 stay off and therefore VCC is not connected to line 55. Also, although transistor 68 goes off, transistors 66 and 64 are maintained on and therefore connect line 55 to ground keeping the output C high.

Assume that both inputs A and B go low while output C is high. Transistors 56, 58, 66 and 68 all go off disconnecting line 55 from ground and transistors 50, 52, 54, and 62 all go on again connecting line 55 to VCC and causing inverter 65 to apply a low signal at output C.

The CMOS Muller-C element of FIG. 3 is preferred over that disclosed in the above Addison-Wesley reference because the latter is an NMOS circuit. The CMOS circuit of FIG. 3 does not consume as much power and the circuit is smaller and is always driving the output signal.

Consider the operation of the circuit of FIG. 2 in more detail. The first Muller-C element 12 provides a pulse stretching function. As illustrated in FIGS. 4 and 5, in the initial state the RDD signal is low, and the RDDRLS signal is high and the GRDD signal is low. When a pulse of positive polarity arrives in the RDD signal, the GRDD output signal from the Muller-C element 12 turns immediately high. However, if the high signal in RDD is quick and forms a short high pulse of extremely short duration, the GRDD signal remains high because the RDDRLS signal remains high. When the GRDD output signal of the Muller-C element is high, it can only be changed when both of its inputs are low at the same time.

The GRDD signal is fed to the three stage synchronizing circuit 14. The sizes and layout design and number of stages of this section can be optimized to achieve the desired mean time between failures for the given sampling clock frequency, incoming pulse rate and fabrication technology without disturbing the other functions of the circuit.

A high GRDD signal is formed at 82 in FIG. 4 and 102 in FIG. 5 and when low CLK and high CLKB signals arrive at 84 in FIG. 4 and 103 in FIG. 5, the first transfer gate 16 is turned on and the high GRDD signal passes through gate 16 into stage 1 of the synchronizing circuit 14. This feeds a high signal to inverter 18 which outputs a low signal. The low signal is then fed back to the transistors 22, 24, turning transistor 22 on and transistor 24 off and locks in a high signal at the input to inverter 18.

At the next half clock cycle at 86 in FIG. 4 and 105 in FIG. 5, CLK is high and CLKB is low and transfer gate 20 of stage 2 is turned on, the low signal output of the inverter 18 is applied to the input of the second inverter 26. This low output is converted by inverter 26 to a high signal which is feed back to transistors 28 and 30, turning transistor 28 on and transistor 30 off and locking the high signal at the input of inverter 26.

At the beginning of the next half clock cycle at 107 in FIG. 4 and 109 in FIG. 5, the third transfer gate 32 of stage 3 is turned on and the high signal out of inverter 26 is fed to the input of inverter 34 which forms a low output. The low output of inverter 34 is feed back to the gates of transistors 36 and 38 to turn on transistor 36 and to turn off transistor 38 which locks the high signal to the input of inverter 34. The low output of inverter 34 is applied to inverter 40 where it is inverted to a high TXD signal or synchronized pulse. The high TXD signal is then inverted by inverter 42 to form a low TXDB signal. Inverter 42 drives the output signal TXDB and isolates the TXD signal from the pulse shrinker function (described below) so that the pulse detector's recovery time is not influenced by loading. The TXD signal has a beginning transition edge which is synchronized with the transition of the CLK and CLKB signals at 92 in FIG. 4 and 108 in FIG. 5. In this particular example, using a three stage sampling synchronizing circuit, the beginning of output pulse at TXD has a minimum latency of one-half clock cycle and a maximum latency of one and one-half clock cycles depending on the time at which the pulse RDD occurs in relation to the clock signals, assuming that the clocks have a fifty percent duty cycle.

The termination of the TXD and TXDB signals will now be explained. The high signal at TXD, beginning at 92 in FIG. 4 and 108 in FIG. 5, causes the NOR gate 46 to apply a low signal to inverter 48 which in turn turns transistor 50 on and applies a low signal to inverter 18 causing a high output from inverter 18. The high output from inverter 18 propagates at clock times 107 and 94 in FIG. 4 and 109 and 110 in FIG. 5 to inverter 40 which then causes the signal TXD and TXDB to go high and low and thereby terminate at line 94 in FIG. 4 and 112 in FIG. 5. Thus the length of the pulses in signals TXD and TXDB are independent of input pulse width at RDD and are controlled by the synchronizer stages 1 and 2, and are always 2 half clock cycles or one full clock cycle after the positive pulse at TXD starts. The output pulse width can be easily expanded by adding additional synchronizer stages.

Referring to the short RDD pulse example of FIG. 4, the initial change in the TXD signal from a low to a high has one other effect if the high RDD pulse has a width of less than three half clock cycles. When the TXD signal goes high at time 92, the pulse in the RDD signal to the Muller-C element 12 will have already transitioned from low to high and back again to low. However, since the RDDRLS signal is still high, as indicated between times 90 and 92, element 12 does not change state and the GRDD signal remains high. The high TXD signal or pulse at time 92, causes NOR gate 46 to apply a low RDDRLS signal to the B input of Muller-C element 12. Element 12 then has a low signal at both of its inputs and changes state to apply a low GRDD signal as indicated at time 93. This low signal matches the low at the node NC and has no effect on stage 1. Thus, the Muller-C element 12 is reset when the low is applied at node NC by transistor 50 and starts the propagation of a signal through the synchronizing circuit 14 to end the TXD and TXDB pulses. The Muller-C element 44 does not change state, due to the low RDD signal when the TXD pulse occurs and, therefore, is not significant to the operation of the circuit in the narrow pulse RDD signal case of FIG. 3.

Consider the wide RDD pulse example of FIG. 4 in which the RDD signal remains high after the termination of the high TXD signal at time 110. In this case, the CLRRD signal out of the second Muller-C element 44 goes high, when the TXD signal goes high because both the TXD and the RDD signals are high and cause element 44 to change state. Therefore, the CLRRD signal from the Muller-C element 44 goes high and remains high until both of signals RDD and TXD go low.

The high CLRD signal maintains a low RDDRLS signal from NOR gate 46 to both the B input of the first Muller-C element 12 and the inverter 48. This prevents the first Muller-C element 12 from changing state and providing a high GRDD signal again until after the RDD signal goes low and RDRLS goes high at time 112.

The low signal to the inverter causes the node NC to be maintained low. No signals will be generated by the circuit while the node NC is low or connected to ground. When RDD signal finally goes back to a low at time 112, both of input signals TXD and RDD to the Muller-C element 44 are low causing the Muller-C element 44 to change state and form a low CLRRD signal. All inputs to NOR gate 46 are now low causing a low signal to inverter 48 causing transistor 50 to release the node NC from ground. Also both inputs to the first Muller-C 12 are then low causing it to change state and form a low GRDD signal. At this point both Muller-C elements are reset to their initial states and will respond to the next high signal as discussed above. As can be seen from the foregoing, the second Muller-C element 44 prevents a second pulse from being generated in response to wide input pulses and insures that the first Muller-C element 12 is reset.

The circuit can also be manually reset using a high RESET signal to the NOR gate 46. This causes the RDDL output signal from the NOR gate to go low. The low output terminates any high TXD signal and clears all the synchronizing stages in circuit 14 by grounding the node NC. It also resets the first Muller-C element 12 as soon as the RDD signal goes low. Then the high RESET signal ends, the circuit is reset.

The inverter and feedback circuits to the input of the inverter (through the two transistors) in each of the stages 1 and 2 form storage circuits (stores) for the last signal presented to the inverter. The next clock after storage of a signal in the store of stage 2 cause the stored signal to be gated out to inverter 34 and 40 creating the synchronized pulses at TXD and TXDB.

In summary, if the high RDD pulse is short, then the input or pulse stretcher stage, consisting of the first Muller-C element 12 holds its output GRDD high long enough so as not to violate the Nyquist's criteria and allow the circuit to reliably start the output pulse TXD. If the high input RDD pulse is wider than the synchronization latency of the circuit, one and one half clock cycles in this example, then the pulse shrinker stage or end pulse stage, made up of the second Muller-C element 44 and the NOR gate 46 limit the high output TXD signal to exactly one clock cycle. The end pulse stage also insures that the pulse stretcher stage is cleared at the trailing end of the high input RDD signal.

The synchronizer is subject to a limitation on the input pulse repetition rate according to the Nyquist criterion. The input pulse repetition rate must be less than half the sampling clock frequency, input CLK in this case. However, because the RDDRLS signal stays low for at least one clock cycle after the TXD signal becomes high and because the maximum latency between the high RDD signal and the high TXD signal is one and one half clock cycles, the high input RDD signal rate cannot be higher than two-fifths of the sampling clock frequency. If the pulse width is narrower than one and one half clock intervals, the circuit requires at least one clock cycle in which the RDD signal is low before accepting the next high signal or pulse. So if the input pulse width is wider, the maximum pulse rate decreases accordingly.

If a longer mean time between failure (MTBF) is desired, this can be achieved in exchange for a longer synchronization latency. The number of synchronizer stages in the synchronizer stage 14 can be increased without affecting any other part of the design. The synchronizing stages are essentially duplicates of each other with inverted transfer gates. The RDDRLS signal into inverter 48 and transistor 50 can be placed wherever desired in the sequence of synchronizer stages. Except for the pulse stretcher input stage and pulse shrinker end pulse stage 47 which receive asynchronous events, the entire circuit is clocked. Signals are shifted systolically without any interclocked segment feedback. The circuit is therefore relatively immune from the functional instability due to process and environmental variations. For example, changes in temperature, power supply voltage and the like. The synchronizing capability of the circuit remains mildly unstable but is at least as good as that of prior systems. The MTBF is still affected by process and environmental factors but the variety of pulse widths which can be accepted by the circuit is not. This characteristic makes the circuit particularly well suited for integrated circuit designs.

Since no clocked portion of the circuit is separated by more than one gate delay, the transistor devices need not be significantly oversized. The Muller-C structure preferably has up to three stacked devices in series so those devices only need to be made moderately wide. The layout of the circuit should be compact and efficient.

Finally, the small number of circuit elements and their simplicity in wiring allow the circuit to be built in much less space than a typical edged triggered pulse detector or phase lock-loop.

Accordingly, the foregoing description should not be read as pertaining only to the precise structures and techniques described, but rather should be read consistent with, and as support for, the following claims, which are to have their fullest fair scope.

We claim:

1. The combination of a rotating data storage disk and a pulse detector for receiving asynchronous input pulses of variable width, derived from the disk and for providing constant width output pulses synchronized with clock pulses, the pulse detector comprising:

a beginning of input pulse sensor for sensing asynchronous variable width input pulses from the disk;

a timing circuit responsive to the sensing of the beginning of one of said input pulses for generating an output pulse of substantially constant pulse width and synchronized with the clock pulses; and an input pulse presence sensor responsive to the presence of the output pulse for inhibiting generation by the timing circuit of another output pulse until after the input pulse, whose beginning is sensed, terminates so that a single output pulse is generated for each said input pulse.

2. The combination of claim 1 comprising a feedback circuit responsive to the presence of the output pulse for enabling termination by the timing circuit of the output pulse after a predetermined time delay equal to the constant pulse width.

3. The combination of claim 1 wherein the timing circuit is characterized in, that upon detecting the beginning of an input pulse, it initiates the propagation of a signal through the timing circuit to start the output pulse and comprising a feedback circuit, operative upon formation of the output pulse, for initiating the propagation of a signal through the timing circuit to terminate the output pulse, after a predetermined time delay.

4. The combination of claim 1 wherein the timing circuit begins and ends each of the output pulses in synchronism with the clock pulses.

5. The combination of claim 1 comprising at least one gate for beginning and ending each of the output pulses in response to occurrences in the clock pulses.

6. The combination of claim 1 wherein the timing circuit comprises a stage having a store, at least one gate for storing a signal in the store upon sensing the beginning of an input pulse and for storing a signal in the store after an output pulse has occurred, and a further gate responsive to the storage content of the store and the clock pulses for commencing and terminating the output pulse in synchronism with the clock pulses.

7. The combination of claim 6 wherein a bistate circuit is coupled to the further gate and is operative, in one of two states, for forming said output pulse.

8. The combination of claim 1 comprising a gate responsive to a clock pulse and the sensing of the beginning of the input pulse for causing the timing circuit to generate the output pulse.

9. The combination of claim 1 wherein the beginning of input pulse sensor comprises a Muller-C element having one input coupled to the input pulse and a second input coupled to the synchronous output pulse.

10. The combination of claim 9 wherein the input pulse presence sensor comprises a second Muller-C element having an input coupled to the input pulse and a second input coupled to the synchronous output pulse and a gate responsive to the output pulse and an output of the second Muller-C element for providing an output signal to the second input of the first named Muller-C element.

11. A pulse detector for generating a constant width output pulse synchronized with clock pulses responsive to asynchronous input pulse of variable width, comprising a beginning of input pulse sensor for sensing asynchronous variable width input pulses;

a timing circuit operative upon sensing the beginning of an input pulse for generating an output pulse of substantially constant pulse width and synchronized with the clock pulses; and an input pulse presence sensor responsive to the output pulse for inhibiting generation by the timing circuit of another output pulse until after the input pulse, whose beginning is sensed, terminates so that a single output pulse is generated for each said input pulse.

12. The pulse detector of claim 11 comprising a feedback circuit responsive to the presence of the output pulse for enabling termination by the timing circuit of the output pulse after a predetermined time delay equal to the constant pulse width.

13. The pulse detector of claim 11 wherein the timing circuit is characterized in that upon detecting the beginning of an input pulse a signal is propagated through the timing circuit to start the output pulse and comprising a feedback circuit, operative upon formation of the output pulse, for initiating the propagation of a signal through the timing circuit to terminate the output pulse, after a predetermined time delay.

14. The pulse detector of claim 11 wherein the timing circuit begins and ends each of the output pulses in synchronism with the clock pulses.

15. The pulse detector of claim 11 comprising at least one gate for beginning and ending each of the output pulses in response to occurrences in the clock pulses.

16. The pulse detector of claim 11 wherein the timing circuit comprises a stage having a store, at least one gate for storing a signal in the store upon sensing the beginning of an input pulse and for storing a signal in the store after an output pulse has occurred, and a further gate responsive to the storage content of the store and the clock pulses for commencing and terminating the output pulse in synchronism with the clock pulses.

17. The pulse detector of claim 11 comprising a bi-state circuit coupled to the further gate and operative, in one of two states, for forming said output pulse.

18. The pulse detector of claim 11 comprising a gate responsive to a clock pulse and the sensing of the beginning of an input pulse for causing the timing circuit to generate the output pulse.

19. The pulse detector of claim 11 wherein the beginning of input pulse detector comprises a Muller-C element having one input coupled to the input pulse and a second input coupled to the synchronous output pulse.

20. The pulse detector of claim 11 wherein the input pulse presence sensor comprises a Muller-C element having an input coupled to the input pulse and a second input coupled to the synchronous output pulse.

21. The pulse detector of claim 19 wherein the input pulse presence sensor comprises a second Muller-C element having an input coupled to the input pulse and a second input coupled to the synchronous output pulse and a gate responsive to the output pulse and an output of the second Muller-C element for providing an output signal to the second input of the first named Muller-C element.

22. A method for converting asynchronous variable width input pulses from a rotating data storage disk to pulses of constant width and synchronize with clock pulses, the method comprising the steps of:
sensing the beginning of an asynchronous variable width input pulse from the disk;
using a timing circuit for generating an output pulse of substantially constant pulse width and synchronize with the clock pulses responsive to the sensing of the beginning of an input pulse; and
sensing the presence of a input pulse and responsive to the input pulse inhibiting the timing circuit from generating another output pulse until after the input pulse, whose beginning is sensed, terminates.

23. The method of claim 22 comprising the step of feeding back a signal responsive to the presence of an output pulse for enabling the time delay circuit to terminate the output pulse after a predetermined time delay equal to the constant pulse width.

24. The method of claim 22 comprising the step of initiating the propagation of a signal through the timing circuit to start the output pulse and feeding back a signal following formation of the output pulse for initiating the propagation of a signal through the timing circuit to terminate the output pulse, after a predetermined time delay.

25. The method of claim 22 comprising the step of beginning and ending each of the output pulses in synchronism with the clock pulses.

26. The method of claim 22 comprising the steps of storing a signal in a stage of the timing circuit upon sensing the beginning input pulse and gating out a signal corresponding to the stored signal in synchronism with the clock pulses.

* * * * *

UNITED STATES PATENT AND TRADEMARK OFFICE
CERTIFICATE OF CORRECTION

PATENT NO.   : 5,117,314                                    Page 1 of 2
DATED        : May 26, 1992
INVENTOR(S)  : Mehdi Bathaee; Takashi Asami It is certified that error appears in the above-identified patent and that said Letters Patent is hereby corrected as shown below:

On the title page:

[56] References Cited, U.S. PATENT DOCUMENTS, change
     "4,938,290" to -- 4,928,290 --.

Column 2, line 10, before "that" change "s" to -- so --.
Column 4, line 56, after "is" delete the comma.

Column 5, line 5, after "has" delete "a".
Column 5, line 42, change "FIG." to -- FIGS. --.
Column 5, lines 49,50, change "compliment" to
         -- complement --.

Column 6, line 21, after "16" insert a period.

Column 7, line 9, change "gone" to -- goes --.
Column 7, line 17, after "FIG. 3" insert a period.
Column 7, line 57, after "elements," insert -- in --; after
         "circuit" change "is" to -- are --.
Column 8, line 43, after "of" delete the two periods.

Column 9, line 11, change "feed" to -- fed --.
Column 9, line 18, change "feed" to -- fed --.

UNITED STATES PATENT AND TRADEMARK OFFICE
CERTIFICATE OF CORRECTION

PATENT NO. : 5,117,314

DATED : May 26, 1992

INVENTOR(S) : Mehdi Bathaee; Takashi Asami

It is certified that error appears in the above-identified patent and that said Letters Patent is hereby corrected as shown below:

Column 14, lines 18,19, change "synchronize" to -- synchronized --.

Column 14, line 21, before "input" delete "a" and insert --an--.

Signed and Sealed this

Seventh Day of September, 1993

Attest:

BRUCE LEHMAN

*Attesting Officer*     *Commissioner of Patents and Trademarks*